US010559747B1

(12) United States Patent
Li et al.

(10) Patent No.: US 10,559,747 B1
(45) Date of Patent: Feb. 11, 2020

(54) TOPOLOGICAL INSULATOR-BASED HIGH EFFICIENCY SWITCHING OF MAGNETIC UNIT, METHOD AND APPLICATIONS

(71) Applicant: THE JOHNS HOPKINS UNIVERSITY, Baltimore, MD (US)

(72) Inventors: Yufan Li, Baltimore, MD (US); Qinli Ma, Baltimore, MD (US); Chia-ling Chien, Cockeysville, MD (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 276 days.

(21) Appl. No.: 15/497,591

(22) Filed: Apr. 26, 2017

Related U.S. Application Data

(60) Provisional application No. 62/327,519, filed on Apr. 26, 2016.

(51) Int. Cl.
*H01L 43/06* (2006.01)
*H01L 43/04* (2006.01)
*G11C 11/18* (2006.01)

(52) U.S. Cl.
CPC .............. *H01L 43/06* (2013.01); *G11C 11/18* (2013.01); *H01L 43/04* (2013.01)

(58) Field of Classification Search
CPC .......... H01L 43/04; H01L 43/06; G11C 11/18
See application file for complete search history.

(56) References Cited

U.S. PATENT DOCUMENTS 8,963,222 B2 * 2/2015 Guo ........................ H01L 43/04 257/295
9,076,537 B2 * 7/2015 Khvalkovskiy ....... H01L 27/228
9,105,832 B2 * 8/2015 Buhrman ................ G11C 11/18
9,425,738 B2 * 8/2016 Wang .................. H03B 15/006
9,691,458 B2 * 6/2017 Ralph ..................... G11C 11/18
9,899,071 B2 * 2/2018 Ma .......................... H01L 43/06
10,153,425 B2 * 12/2018 Han ...................... H01L 43/065

* cited by examiner

*Primary Examiner* — Allison Bernstein
(74) *Attorney, Agent, or Firm* — MH2 Technology Law Group, LLP

(57) ABSTRACT

A magneto-electronic device may include: a spin-orbit torque (SOT) generator layer; a magnetic memory layer; and/or sensing electrodes configured to measure a Hall effect of the magnetic memory layer. The SOT generator layer may include topological insulator material, and the magnetic memory layer may include ferromagnetic material with perpendicular magnetic anisotropy. A magneto-electronic device may include: a spin-orbit torque (SOT) generator layer; a first magnetic memory layer on the SOT generator layer; an insulating layer on the first magnetic memory layer; and/or a second magnetic memory layer on the insulating layer. The SOT generator layer may include topological insulator material. The first magnetic memory layer and the second magnetic memory layer may include ferromagnetic material with either perpendicular magnetic anisotropy or in-plane magnetic anisotropy.

20 Claims, 4 Drawing Sheets

TOPOLOGICAL INSULATOR-BASED HIGH EFFICIENCY SWITCHING OF MAGNETIC UNIT, METHOD AND APPLICATIONS

CROSS REFERENCE TO RELATED APPLICATIONS

The present application claims the benefit of, and relies on the filing date of, U.S. Provisional Application No. 62/327,519, and entitled "Topological Insulator-Based High Efficiency Switching of Magnetic Unit, Method and Applications", filed on Apr. 26, 2016, in the U.S. Patent and Trademark Office, the entire contents of which are incorporated herein by reference.

STATEMENT OF GOVERNMENTAL SUPPORT

This invention was made with government support under grant number SC0012670, awarded by the Department of Energy, and a Defense Advanced Research Projects Agency (DARPA) award. The government has certain rights in the invention.

FIELD

Some example embodiments relate to using electric currents to manipulate magnetic units through spin-orbit torque, which in particular, originates from strong spin-orbit interactions hosted by topological insulators. Some example embodiments of the magneto-electronic devices find application in non-volatile magnetic memory devices.

BACKGROUND

Ferromagnets are natural-born materials suitable for persistent, non-volatile recording media of information. In the present state of the art, ferromagnetic (FM) thin films with perpendicular magnetic anisotropy (PMA) may be widely employed as high-density data storage media. While a ferromagnet always may be controlled by a magnetic field, toward higher integration and lower energy consumption dictated by modern computing devices, it is highly desired to manipulate the magnetization via electrical means, instead of by a magnetic field. One implementation is a non-volatile magnetic random access memory (MRAM) utilizing spin-transfer torque (STT-MRAM). Such a device utilizes the spin-transfer torque (STT) generated by an electrical current to switch the magnetization of a free layer with respect to a magnetic pinning layer. This technique, however, requires high values of current density to pass through the magnetic layers, typically greater than $10^7$ amperes-per-centimeters-squared (A/cm$^2$), which is close to the breakdown limit of the device. A more reliable method to control the magnetization of a memory unit is desired for modern computing applications.

Another method has been proposed to overcome the aforementioned drawbacks of STT-MRAM. Instead of a spin-polarized charge current that carries STT, pure spin current may be exploited for manipulating the magnetic polarization, which is free of the damaging effects of a charge current (e.g., Joule heating and electromigration). A typical device using this technique may comprise a non-magnetic/ferromagnetic (FM) multilayer. The non-magnet layer may be a heavy metal (HM), such as platinum (Pt), tungsten (W), or alloys of Pt or W, which has strong spin-orbit coupling. A charge current flowing in the HM layer will subsequently generate a pure spin current which may inject into the adjacent FM layer, and may cause the magnetic moment of the latter to switch as if under an external torque. Therefore, the role of the spin current in such a process is usually termed as the spin-orbit torque (SOT). The advantage of this technique is that the charge current is not required to flow through the FM layer, which is potentially harmful to the magnetic memory unit. However, a large charge current of similar magnitude, $10^7$ A/cm$^2$, is still required to flow in the HM layer in order to generate SOT strong enough to switch the magnetization. Accordingly, there is a need in the art to generate SOT more efficiently and to replace the present design of HM/FM multilayer structure.

SUMMARY

In some example embodiments, a magneto-electronic device may comprise: a spin-orbit torque (SOT) generator layer; a magnetic memory layer; and/or sensing electrodes configured to measure a Hall effect of the magnetic memory layer. The SOT generator layer may comprise topological insulator material. The magnetic memory layer may comprise ferromagnetic material with perpendicular magnetic anisotropy.

In some example embodiments, a magneto-electronic device may comprise: a spin-orbit torque (SOT) generator layer; a first magnetic memory layer on the SOT generator layer; an insulating layer on the first magnetic memory layer; and/or a second magnetic memory layer on the insulating layer. The SOT generator layer may comprise topological insulator material. The first magnetic memory layer and the second magnetic memory layer may comprise ferromagnetic material with either perpendicular magnetic anisotropy or in-plane magnetic anisotropy.

BRIEF DESCRIPTION OF THE DRAWINGS

The accompanying drawings provide visual representations which will be used to more fully describe the representative embodiments disclosed herein and may be used by those skilled in the art to better understand them and their inherent advantages. In these drawings, like reference numerals identify corresponding elements and.

Figure 5A:
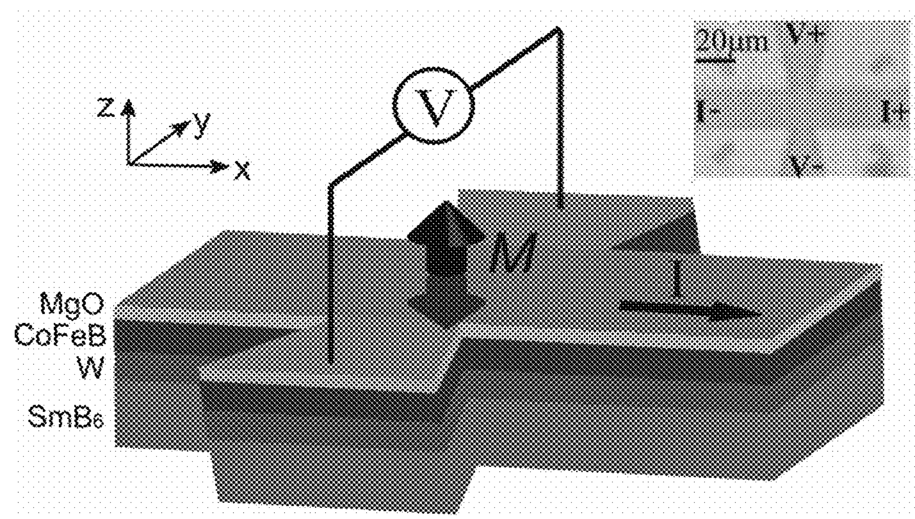
FIG. 5A shows an example of a particular device according to some example embodiments. The insert is a picture of the actual device taken under a microscope (top view). A typical structure is $SmB_6$ (t)/W (0.8 nm)/$Co_{40}Fe_{40}B_{20}$ (1 nm)/MgO (1.8 nm) in which the numbers in the brackets indicates the thickness of the layers [elements boron (B), cobalt (Co), iron (Fe), magnesium (Mg), oxygen (O), samarium (Sm), and/or tungsten (W)]. The thickness 't' of the SOT generator layer $SmB_6$ is varied, for example, from 0 nanometers (nm) to 50 nm. Data obtained from this series of devices will be shown in the following figures which manifests various advantages of some example embodiments.
Figure 5B:
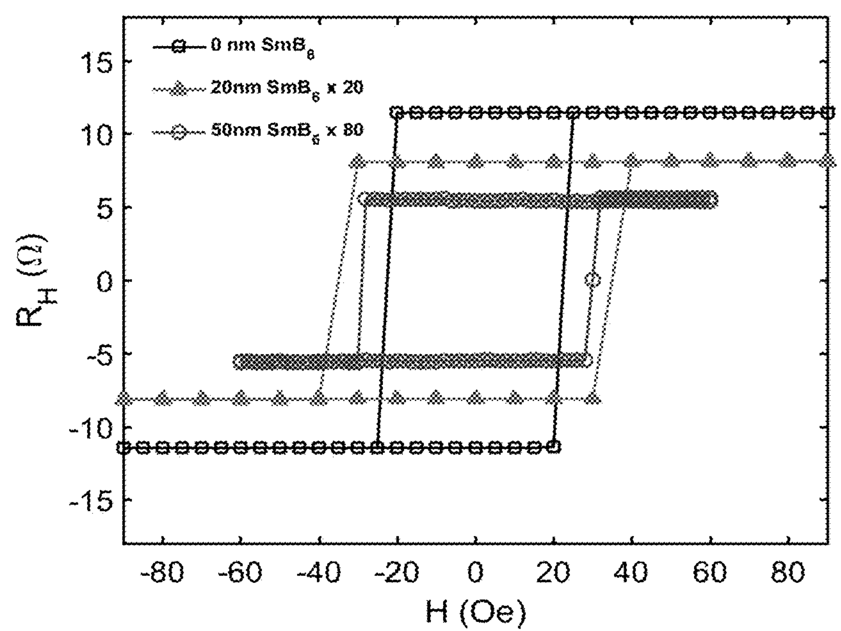
Figure 6A:
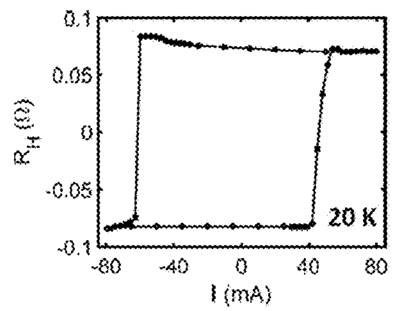
Figure 6B:
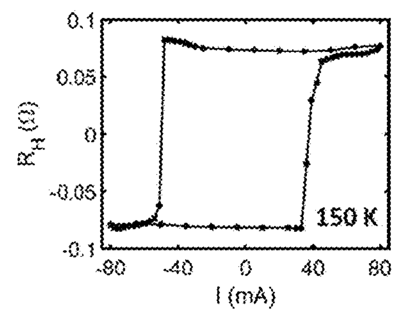
Figure 6C:
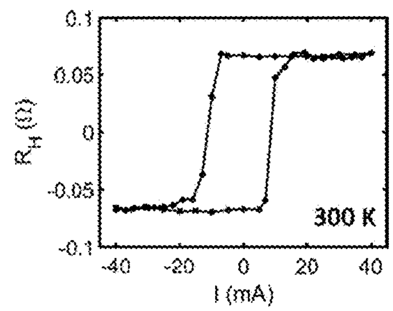
Figure 7:
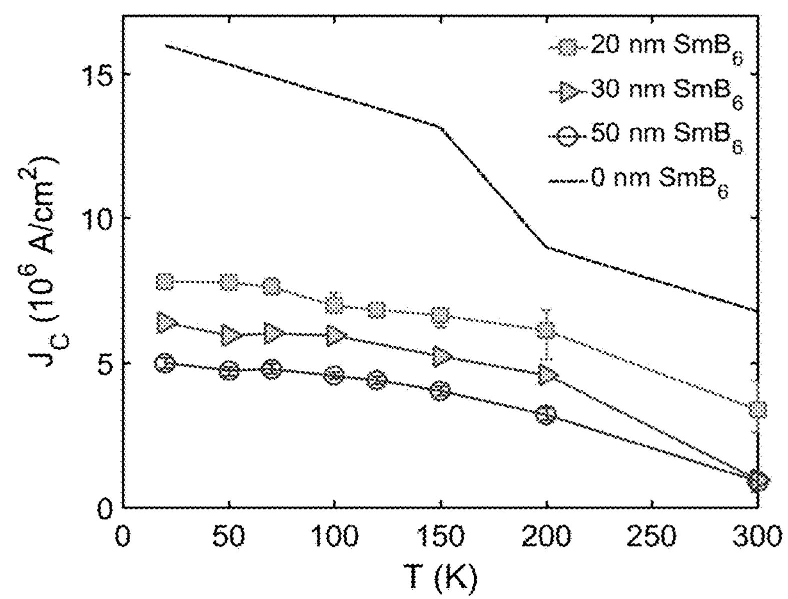

FIG. 5B provides data obtained from the devices with structures as depicted in FIG. 5A. FIG. 5B plots the anomalous Hall resistance RH in ohms (Ω) as a function of the external magnetic field $H_z$ in oersteds (Oe) applied perpendicular to the film plane, for devices with different $SmB_6$ layer thicknesses (0 nm, 20 nm, and 50 nm-thick). The square loops indicate that all devices acquire perpendicular magnetic anisotropy (PMA). The RH in ohms (Ω) of the devices with 20 nm-thick and 50 nm-thick $SmB_6$ is magnified by 20 and 80 times, respectively, in order to be visible in FIG. 5B;

FIGS. 6A-6C provide data obtained from the device with structures as depicted in FIG. 5A. In FIGS. 6A-6C, the thickness of $SmB_6$ layer is 50 nm. FIGS. 6A-6C plot RH in ohms (Ω) as a function of the applied switching current in milliamperes (mA), under an in-plane magnetic field of 500 oersteds (Oe) applied in the +x direction. In FIG. 6A the data is obtained at 20 K, in FIG. 6B the data is obtained at 150 K, and in FIG. 6C the data is obtained at 300 K; and FIG. 7 provides data obtained from the devices with structures as depicted in FIG. 5A. FIG. 7 plots critical current density ($J_C$) in $10^6$ amperes-per-centimeters-squared ($A/cm^2$) as a function of temperature in degrees Kelvin (K). FIG. 7 summaries the critical current flowing through the SOT generator layers, when the switching of magnetization of the magnetic memory layer occurs.

DETAILED DESCRIPTION

Example embodiments will now be described more fully with reference to the accompanying drawings. Example embodiments, however, may be embodied in many different forms and should not be construed as being limited to the examples set forth herein. Rather, these examples are provided so that this disclosure will be thorough and complete, and will fully convey the scope to those skilled in the art. In the drawings, some details may be simplified and/or may be drawn to facilitate understanding rather than to maintain strict structural accuracy, detail, and/or scale. For example, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, or section could be termed a second element, component, region, layer, or section without departing from the teachings of examples.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation(s) depicted in the figures.

The terminology used herein is for the purpose of describing particular examples only and is not intended to be limiting of examples. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which examples belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Example embodiments pertain to devices and methods for generating SOT more efficiently than in the present state of the art. A device in accordance with some example embodiments comprises a generator of SOT, a magnetic memory unit, and a sensing unit for reading the information stored in the memory unit, manifested as the orientation of its magnetic moment. The generator of SOT in some example embodiments comprises a novel class of materials known as topological insulators (TI). These materials are band insulators with conducting spin-chiral surface state, from which strong SOT may be produced upon the flowing of a charge current. The generation of SOT may be more effective than known HM materials. The high efficiency of SOT generation thus requires much less operating current, greatly reduces energy consumption, and enhances reliability of the memory device.

In some example embodiments, a device is comprised of a layer of TI film as the SOT generator, with an adjacent ferromagnetic (FM) layer as the magnetic memory unit. The magnetization of the FM layer is oriented perpendicular to the film plane (e.g., with perpendicular magnetic anisotropy (PMA)). Two voltage probes are patterned on the FM layer as the sensing unit. The method in accordance with some example embodiments is based on applying an in-plane switching current flowing through the TI film, generating the SOT to align the magnetization of the FM layer. A small in-plane magnetic field is applied parallel to the switching current in the meantime to assist SOT switching, as previously established. After the magnetization of the FM layer has been set by the SOT, a small sensing current applied through the FM layer reads out the magnetization direction via the anomalous Hall effect.

In some example embodiments, a device also comprises a layer of TI film as the SOT generator, with an adjacent FM layer with PMA as the magnetic memory unit. An additional magnetic pinning layer is stacked over the FM layer to offer an effective in-plane field. The magnetic state of the FM layer may be manipulated by a switching current through the TI film, as discussed above, but without the need of an external magnetic field. The magnetic state of the FM layer may also be probed by a sensing current through the layer and revealed by the resultant anomalous Hall effect signal.

In some example embodiments, an FM memory unit is placed on top of the TI film with an in-plane magnetization, instead of having PMA. The sensing unit is positioned on top of the FM memory layer, which is composed of an insulating barrier layer and an FM pinning layer. The magnetization of the FM memory layer may be oriented by a switching current through the TI film, without the need of external magnetic field. The magnetic orientation then may be read by the magneto-resistance probed by a sensing flowing vertically through the FM memory layer and the sensing unit.

In some example embodiments, a device comprises the TI SOT generator film, topped by an FM memory layer with PMA. The sensing unit, comprised of an insulating barrier layer and an FM pinning layer, is positioned on top of the FM memory layer. The magnetization of the FM memory layer may be oriented by a switching current through the TI film, with the assistance of a small external magnetic field. The magnetic orientation then may be read by the magneto-resistance between the FM memory layer and the sensing unit.

Figure 1:
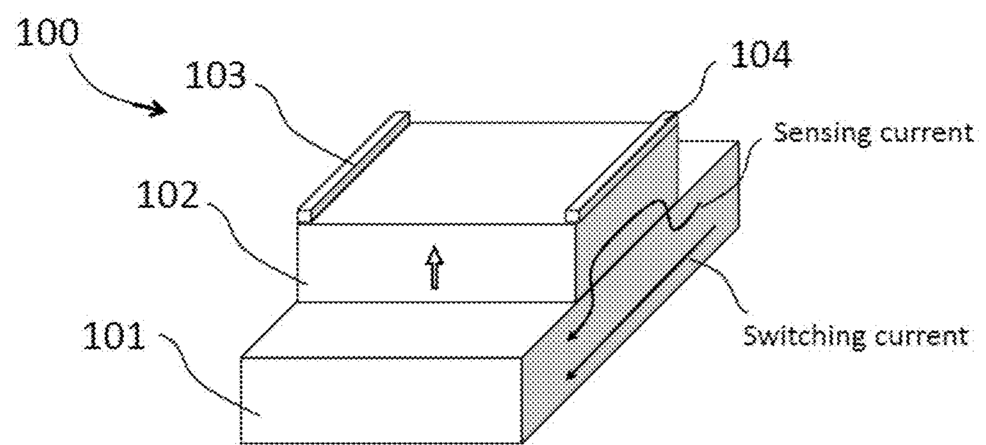
FIG. 1 is a schematic illustration of a magneto-electric device according to some example embodiments, in which the perpendicular magnetization of the magnetic memory layer may be manipulated by an in-plane electric current, with the assistance of a small in-plane magnetic field.

FIG. 1 provides a schematic illustration of device 100 according to some example embodiments. Device 100 includes spin-orbit torque (SOT) generator layer 101, ferromagnetic (FM) memory layer 102 with PMA, and two sensing voltage probes 103 and 104. The magnetization orientation of FM memory layer 102 may be manipulated by the SOT from SOT generator layer 101, generated by a switching electric current applied in SOT generator layer 101, under the assistance of a small magnetic field parallel to the current direction. The magnetization orientation of FM memory layer 102 may be read by measuring the Hall voltage across sensing voltage probes 103 and 104, while a sensing current is flowing through FM memory layer 102.

As used herein, the term "SOT generator layer" refers to a conducting layer comprising topological insulators (TI). These are the type of materials that are embedded with a spin-chiral conducting surface state which is protected by time-reversal symmetry. The spin-chiral surface state harbors a property such that the spin of the charge carrier is coupled to its momentum, known as spin-momentum locking. While a current is flowing in the topological insulator (TI) and hence through its surface, the momentum of charge carriers is set to the current direction, therefore polarizing the spins possessed by the charge carriers and generating the SOT in the adjacent magnetic layer (FM memory layer 102).

In some example embodiments, the SOT generator layer may comprise at least one of $SmB_6$, $YbB_6$, $YbB_{12}$, $Bi_2Se_3$, $Bi_2Te_3$, $Sb_2Te_3$, or $BiSbTeSe_2$ (e.g., the SOT generator layer may comprise $SmB_6$) [elements antimony (Sb), bismuth (Bi), boron (B), samarium (Sm), selenium (Se), tellurium (Te), and/or ytterbium (Yb)]. In some example embodiments, the SOT generator layer consists essentially of at least one of $SmB_6$, $YbB_6$, $YbB_{12}$, $Bi_2Se_3$, $Bi_2Te_3$, $Sb_2Te_3$, or $BiSbTeSe_2$ (e.g., the SOT generator layer may consist essentially of $Bi_2Se_3$ or $Bi_2Te_3$). In some example embodiments, the SOT generator layer consists of at least one of $SmB_6$, $YbB_6$, $YbB_{12}$, $Bi_2Se_3$, $Bi_2Te_3$, $Sb_2Te_3$, or $BiSbTeSe_2$ (e.g., the SOT generator layer may consist of $YbB_6$ and $YbB_{12}$).

In some example embodiments, the SOT generator layer may comprise one or more Kondo insulators (e.g., $SmB_6$, $YbB_6$, or $YbB_{12}$). In some example embodiments, the SOT generator layer may comprise one or more bismuth-based chalcogenides (e.g., $Bi_2Se_3$, $Bi_2Te_3$, $Sb_2Te_3$, or $BiSbTeSe_2$).

In some example embodiments, the SOT generator layer may comprise at least one of α-Sn, $Bi_{1-x}Sb_x$, Sb, $Bi_2Te_2Se$, $Bi_2Te_3$, $Sb_2Te_3$, $Bi_{2-x}Sb_xTe_{3-y}Se_y$, $Bi_2Te_{3-x}Se_x$, $Bi_2Te_{3-x}S_x$, $Sb_2Te_2Se$, $Bi_2Te_2Se$, $Bi_2Se_2Se$, $Bi_2Te_2S$, $Bi_2Se_2S$, $TlBiSe_2$, $TlBiTe_2$, $TlBiS_2$, $TlBiSe_2$, $PbBi_2Te_4$, $PbSb_2Te_4$, $GeBi_2Te_4$, $PbBi_4Te_7$, $GeBi_{4-x}Sb_xTe_7$, $Pb_5(Bi_2Se_3)_6$, $Se_5(Bi_2Se_3)_6$, $(Bi_2)(Bi_2Se_{3-x}S_x)$, $(Bi_2)(Bi_2Te_3)_2$, SnTe, $Pb_{1-x}Sn_xTe$, $Pb_{1-x}Sn_xSe$, $Ag_2Te$, $Bi_{14}Rh_3I_9$, LuBiPt, DyBiPt, GdBiPt, or $Nd_2(Ir_{1-x}Rh_x)_2O_7$ [elements antimony (Sb), bismuth (Bi), dysprosium (Dy), gadolinium (Gd), germanium (Ge), iodine (I), iridium (Ir), lead (Pb), lutetium (Lu), neodymium (Nd), oxygen (O), platinum (Pt), rhodium (Rh), selenium (Se), silver (Ag), sulfur (S), tellurium (Te), thallium (Tl), and/or tin (Sn)].

As used herein, the term "ferromagnetic (FM) memory layer" refers to a composite layer which contains a ferromagnetic metal layer with suitable magnetic anisotropy (e.g., PMA or in-plane magnetization). The composite layer may contain additional metal or insulator layers in order to acquire the desired magnetic anisotropy. For example, in order to acquire PMA, the composite layer may take the structure of tungsten (W) (e.g., β-W) (0.8 nm-thick)/$Co_{40}Fe_{40}B_{20}$ (1 nm-thick)/MgO (2 nm-thick), or Pt (1 nm-thick)/Co (1 nm-thick), although example embodiments are not limited to only the use of the these two examples [elements boron (B), cobalt (Co), iron (Fe), magnesium (Mg), oxygen (O), platinum (Pt), and/or tungsten (W)].

Ferromagnetic (FM) memory layer 102 may comprise, for example, at least one of cobalt (Co), iron (Fe), nickel (Ni), CoFeAl, CoFeB, CoMnSi, CoPd, CoPt, CoTb, FePd, FePt, GdCo, MnGa, MnGe, MnSi, $Mn_3Ga$, $Mn_3Ge$, $Mn_3Sn$, TeFeCo, [Co/Ni]n multilayers, [Co/Pd]n multilayers, [Co/Pt]n multilayers, any alloy thereof, or any combination thereof [elements aluminum (Al), boron (B), cobalt (Co), gadolinium (Gd), gallium (Ga), germanium (Ge), iron (Fe), manganese (Mn), nickel (Ni), palladium (Pd), platinum (Pt), silicon (Si), tellurium (Te), terbium (Tb), and/or tin (Sn)]. The variable 'n' is greater than or equal to 1 and less than or equal to 10. Preferably, the variable 'n' is greater than or equal to 1 and less than or equal to 5.

Figure 2:
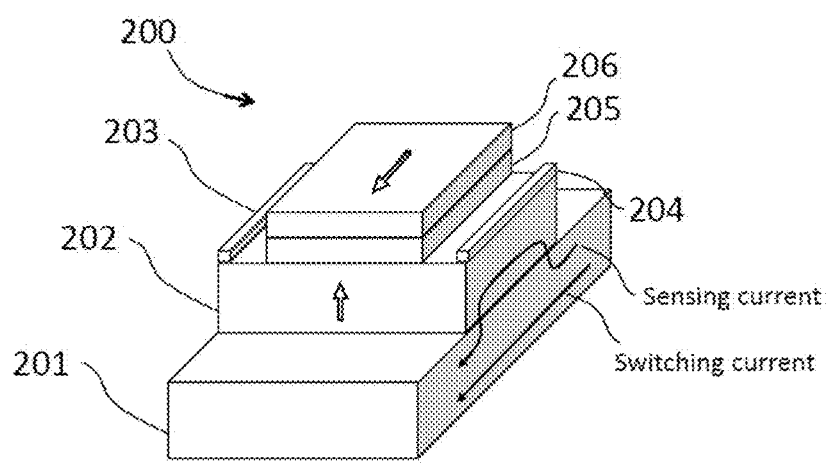
FIG. 2 is a schematic illustration of a magneto-electric device according to some example embodiments, in which a magnetic pinning layer is added to gain an advantage in that the current-induced switching does not require an external magnetic field.

FIG. 2 provides a schematic illustration of device 200 according to some example embodiments. Device 200 includes SOT generator layer 201, ferromagnetic (FM) memory layer 202 with PMA, and two sensing voltage probes 203 and 204, similar to device 100. Additionally, a magnetic pinning structure comprised of nonmagnetic spacing layer 205 and magnetic pinning layer 206 are added on top, which provides an in-plane dipolar magnetic field. The dipolar magnetic field is exerted on FM memory layer 202 and, therefore, no external magnetic field is required when the switching current is applied to switch FM memory layer 202.

Ferromagnetic (FM) memory layer 202 may comprise, for example, at least one of cobalt (Co), iron (Fe), nickel (Ni), CoFeAl, CoFeB, CoMnSi, CoPd, CoPt, CoTb, FePd, FePt, GdCo, MnGa, MnGe, MnSi, $Mn_3Ga$, $Mn_3Ge$, $Mn_3Sn$, TeFeCo, [Co/Ni]n multilayers, [Co/Pd]n multilayers, [Co/Pt]n multilayers, any alloy thereof, or any combination thereof. The variable 'n' is greater than or equal to 1 and less than or equal to 10. Preferably, the variable 'n' is greater than or equal to 1 and less than or equal to 5.

Magnetic pinning layer 206 may comprise antiferromagnetic material. Magnetic pinning layer 206 may comprise, for example, at least one of chromium (Cr), cobalt (Co), iron (Fe), nickel (Ni), manganese (Mn), palladium (Pd), platinum (Pt), FeMn, IrMn, PtMn, $Mn_3Ga$, $Mn_3Ge$, $Mn_3Sn$, chromium oxide (CrO, $Cr_2O_3$), cobalt oxide (CoO, $Co_2O_3$, $Co_3O_4$), manganese oxide (MnO, $Mn_2O_3$, $Mn_3O_4$), or nickel oxide (NiO, $Ni_2O_3$), any alloy thereof, or any combination thereof.

Figure 3:
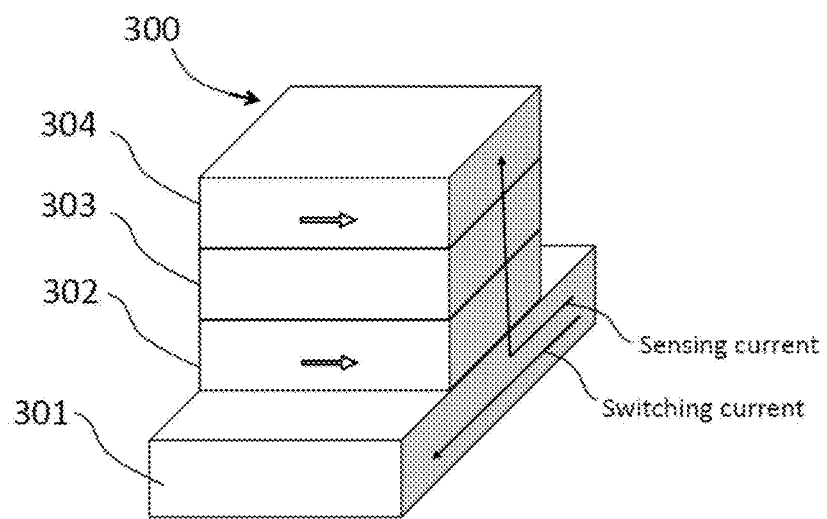
FIG. 3 is a schematic illustration of a magneto-electric device according to some example embodiments, in which the in-plane magnetization of the magnetic memory layer may be manipulated by an in-plane electric current, without the need of an external magnetic field.

FIG. 3 provides a schematic illustration of device 300 according to some example embodiments. Device 300 includes SOT generator layer 301, contacting ferromagnetic (FM) memory layer 302, with the magnetization laying in-plane. The other interface of FM memory layer 302 is in contact with the sensing unit comprised of insulating layer 303 and second FM memory layer 304, with magnetization pinned parallel or anti-parallel with that of FM memory layer 302. FM memory layer 302, insulating layer 303, and second FM memory layer 304 compose a magnetic tunneling junction structure. The magnetic moment orientation of FM memory layer 302 may be manipulated by applying a switching current through SOT generator layer 301. The magnetic state may be read out by the magneto-resistance between FM memory layer 302 and second FM memory layer 304, while a sensing current is applied vertically through the stacking structure.

Ferromagnetic (FM) memory layer 302 may comprise, for example, at least one of cobalt (Co), iron (Fe), nickel (Ni), CoFeAl, CoFeB, CoMnSi, CoPd, CoPt, CoTb, FePd, FePt, GdCo, MnGa, MnGe, MnSi, $Mn_3Ga$, $Mn_3Ge$, $Mn_3Sn$, TeFeCo, [Co/Ni]n multilayers, [Co/Pd]n multilayers, [Co/Pt]n multilayers, any alloy thereof, or any combination thereof. The variable 'n' is greater than or equal to 1 and less than or equal to 10. Preferably, the variable 'n' is greater than or equal to 1 and less than or equal to 5.

Similarly, second ferromagnetic (FM) memory layer 304 may comprise, for example, at least one of cobalt (Co), iron (Fe), nickel (Ni), CoFeAl, CoFeB, CoMnSi, CoPd, CoPt, CoTb, FePd, FePt, GdCo, MnGa, MnGe, MnSi, $Mn_3Ga$, $Mn_3Ge$, $Mn_3Sn$, TeFeCo, [Co/Ni]n multilayers, [Co/Pd]n multilayers, [Co/Pt]n multilayers, any alloy thereof, or any combination thereof. The variable 'n' is greater than or equal to 1 and less than or equal to 10. Preferably, the variable 'n' is greater than or equal to 1 and less than or equal to 5.

As used herein, the term "insulating layer" refers to an electrical insulator. The insulating layer provides a tunneling potentially energy barrier in which electrons may pass through by quantum mechanical tunneling to provide a tunneling current. The structure and composition of the tunneling barrier has a large effect on the probability of electron tunneling through the barrier.

As used herein, the term "$AlO_x$" refers to stoichiometric or non-stoichiometric compounds of aluminum and oxygen, including aluminum(I) oxide ($Al_2O$), aluminum(II) oxide (AlO), aluminum(III) oxide ($Al_2O_3$), and combinations thereof.

In some example embodiments, the insulating layer comprises at least one of $AlO_x$, boron nitride (BN), $HfO_2$, magnesium oxide (MgO), boron-doped MgO, silicon oxide (SiO, $SiO_2$), tantalum oxide ($TaO_2$, $Ta_2O_5$), stoichiometric or non-stoichiometric titanium oxide (TiO, $TiO_2$, $Ti_2O_3$), or zirconium oxide (ZrO, $ZrO_2$) (e.g., the insulating layer may comprise MgO) [elements aluminum (Al), hafnium (Hf), magnesium (Mg), oxygen (O), tantalum (Ta), and/or zirconium (Zr)]. In some example embodiments, the insulating layer consists essentially of at least one of $AlO_x$, $HfO_2$, MgO, $Ta_2O_5$, or ZrO (e.g., the insulating layer may consist essentially of $Al_2O_3$ or ZrO). In some example embodiments, the insulating layer consists of at least one of $AlO_x$, $HfO_2$, MgO, $Ta_2O_5$, or ZrO (e.g., the insulating layer may consist of $HfO_2$ and $Ta_2O_5$).

Figure 4:
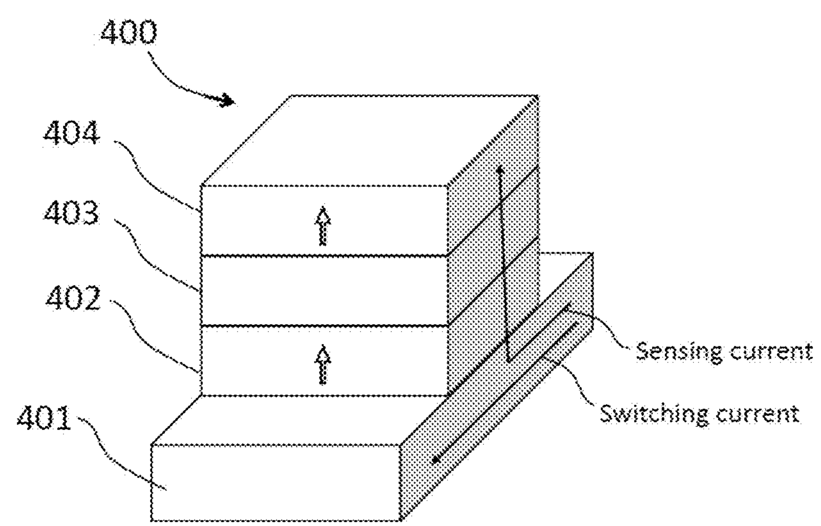
FIG. 4 is a schematic illustration of a magneto-electric device according to some example embodiments, which allows manipulating and reading the information stored in the magnetic memory layer with perpendicular magnetization, using a 3-terminal device.

Device 400 according to some example embodiments is depicted in FIG. 4. Device 400 is similar to device 300, comprising SOT generator layer 401, FM memory layer 402, insulating layer 403, and second FM memory layer 404, respectively. FM memory layer 402 possesses PMA rather than in-plane magnetization; similarly, second FM memory layer 404 possesses PMA rather than in-plane magnetization.

Ferromagnetic (FM) memory layer 402 may comprise, for example, at least one of cobalt (Co), iron (Fe), nickel (Ni), CoFeAl, CoFeB, CoMnSi, CoPd, CoPt, CoTb, FePd, FePt, GdCo, MnGa, MnGe, MnSi, $Mn_3Ga$, $Mn_3Ge$, $Mn_3Sn$, TeFeCo, [Co/Ni]n multilayers, [Co/Pd]n multilayers, [Co/Pt]n multilayers, any alloy thereof, or any combination thereof. The variable 'n' is greater than or equal to 1 and less than or equal to 10. Preferably, the variable 'n' is greater than or equal to 1 and less than or equal to 5.

Similarly, second ferromagnetic (FM) memory layer 404 may comprise, for example, at least one of cobalt (Co), iron (Fe), nickel (Ni), CoFeAl, CoFeB, CoMnSi, CoPd, CoPt, CoTb, FePd, FePt, GdCo, MnGa, MnGe, MnSi, $Mn_3Ga$, $Mn_3Ge$, $Mn_3Sn$, TeFeCo, [Co/Ni]n multilayers, [Co/Pd]n multilayers, [Co/Pt]n multilayers, any alloy thereof, or any combination thereof. The variable 'n' is greater than or equal to 1 and less than or equal to 10. Preferably, the variable 'n' is greater than or equal to 1 and less than or equal to 5.

EXAMPLES

The following example embodiments have been included to provide guidance to one of ordinary skill in the art for practicing representative embodiments of the presently disclosed subject matter. In light of the present disclosure and the general level of skill in the art, those of skill may appreciate that the following example is intended to be exemplary only and that numerous changes, modifications, and alterations may be employed without departing from the scope of the presently disclosed subject matter. The following example is offered by way of illustration and not by way of limitation.

The magneto-electronic devices below are in accordance with device 100 shown in FIG. 1. The typical structure of the devices is Si/$SmB_6$ (t)/W (0.8 nm)/$Co_{40}Fe_{40}B_{20}$ (1 nm)/MgO (1.8 nm)/Ta (1 nm) [elements boron (B), cobalt (Co), iron (Fe), magnesium (Mg), oxygen (O), silicon (Si), samarium (Sm), tantalum (Ta), and/or tungsten (W)]. The silicon (Si) serves as the substrate on which the layers are deposited in a multi-source, ultra-high vacuum sputtering system with base vacuum of 1*x* 10-8 Torr, for example. The thickness of each layer is indicated as the number inside the brackets. The Kondo insulator $SmB_6$ is known to be a strongly-correlated topological insulator, which is employed as SOT generator layer 101. The thickness is varied from 0 nm to 50 nm. The composite layer W (0.8 nm)/$Co_{40}Fe_{40}B_{20}$ (1 nm)/MgO (1.8 nm) serves as FM memory layer 102, which possesses PMA after post-growth annealing at 300° C. in vacuum for 20 minutes.

In some example embodiments, the thickness of the $SmB_6$ layer may be greater than or equal to 0 nm and less than or equal to 500 nm, preferably greater than or equal to 20 nm and less than or equal to 200 nm (e.g., 20 nm, 30 nm, 50 nm).

In some example embodiments, the thickness of the tungsten (W) layer may be greater than or equal to 0 nm and less than or equal to 5 nm, preferably greater than or equal to 0.5 nm and less than or equal to 2 nm (e.g., 0.8 nm). In some example embodiments, the thickness of the CoFeB layer (e.g., $Co_{40}Fe_{40}B_{20}$) may be greater than or equal to 0.2 nm and less than or equal to 5 nm, preferably greater than or equal to 0.6 nm and less than or equal to 2 nm (e.g., 1 nm). In some example embodiments, the thickness of the MgO layer may be greater than or equal to 0 nm and less than or equal to 10 nm, preferably greater than or equal to 1 nm and less than or equal to 2 nm (e.g., 1.8 nm, 2 nm). In some example embodiments, the thickness of the tantalum (Ta) layer may be greater than or equal to 0 nm and less than or equal to 2 nm (e.g., 1 nm).

The tantalum (Ta) layer may serve as a capping layer to protect the underlying structure from oxidization (e.g., to reduce or prevent oxidation). In addition or in the alternative to tantalum (Ta), the capping layer may comprise at least one of $AlO_x$, boron nitride (BN), $HfO_2$, magnesium oxide (MgO), boron-doped MgO, silicon oxide (SiO, $SiO_2$), tantalum oxide ($TaO_2$, $Ta_2O_5$), stoichiometric or non-stoichiometric titanium oxide (TiO, $TiO_2$, $Ti_2O_3$), or zirconium oxide (ZrO, $ZrO_2$).

As discussed above, in order to acquire PMA, the composite layer may take the structure of β-W/$Co_{40}Fe_{40}B_{20}$/MgO, for example. Other structures include, for example, platinum (Pt)/cobalt (Co)/platinum (Pt) (e.g., $SmB_6$/Pt/Co/Pt) or [Co/Ni]n multilayers (e.g., $SmB_6$/Co/Ni/Co/Ni/ . . . /Co/capping layer). In the $SmB_6$/Pt/Co/Pt structure, the thickness of the $SmB_6$ layer may be greater than or equal to 0 nm and less than or equal to 500 nm, preferably greater than or equal to 20 nm and less than or equal to 200 nm (e.g., 20 nm, 30 nm, 50 nm); the thickness of the first platinum (Pt) layer may be greater than or equal to 0.2 nm and less than or equal to 5 nm, preferably greater than or equal to 1 nm and less than or equal to 2.5 nm; the thickness of the cobalt (Co) layer may be greater than or equal to 0.2 nm and less than or equal to 2 nm, preferably greater than or equal to 0.5 nm and less than or equal to 1 nm; and the thickness of the second platinum (Pt) layer may be greater than or equal to 0 nm and less than or equal to 10 nm. In the $SmB_6$/Co/Ni/Co/Ni/ . . . /Co structure, the thickness of the $SmB_6$ layer may be greater than or equal to 0 nm and less than or equal to 500 nm, preferably greater than or equal to 20 nm and less than or equal to 200 nm (e.g., 20 nm, 30 nm, 50 nm); the thickness of the cobalt (Co) layers may be greater than or equal to 0.1 nm and less than or equal to 2 nm, preferably greater than or equal to 0.3 nm and less than or equal to 1 nm; and the thickness of the nickel (Ni) layers may be greater than or equal to 0.1 nm and less than or equal to 4 nm, preferably greater than or equal to 0.6 nm and less than or equal to 2 nm.

The film is hence patterned into Hall bar structure with 20 micron (μm)-wide current channel, as depicted in FIG. 5A. The PMA of the CoFeB layer is confirmed by the sharp switch of the anomalous Hall effect (AHE) as a function of applied perpendicular magnetic field ($H_z$), as shown in FIG. 5B, where the positive and negative Hall resistance represents the CoFeB magnetization direction up and down, respectively. The absolute magnitude of the Hall resistance decreases as the thickness of $SmB_6$ increases, due to the shunting effect from the nonmagnetic $SmB_6$ layer. From the reduced Hall resistance it also may be estimated how much current is flowing through the $SmB_6$ layer and the composite W/CoFeB/MgO layer.

To demonstrate that the magnetization of CoFeB may be switched by the current-induced SOT, a current train of 50 electrical pulses was applied, each with the duration of 12 milliseconds (msec), followed by a small sensing current of 0.5 milliamperes (mA) to probe the AHE. A small in-plane magnetic field of 500 oersteds (Oe) was also applied parallel to the current direction (+x). When the current exceeds a critical value $I_c$, the magnetization of the CoFeB layer will be deterministically switched to either up or down, depending on the current direction. FIG. 6 shows the representative switching curves from a device with 50 nm-thick $SmB_6$ layer, at three characteristic temperatures 20 K, 150 K, and 300 K. The SOT-induced switching occurs at all temperatures.

FIG. 7 summarizes the critical current density ($J_C$) flowing in the SOT generator film, when the switching occurs. For the device without an $SmB_6$ layer (0 nm, dashed line), the 0.8 nm-thick W layer is regarded as the SOT generator film. $J_C$ decreases as the thickness of $SmB_6$ thickness increases, evidencing the $SmB_6$ layer as the major source of SOT. Comparing the device with 50 nm-thick $SmB_6$ layer and without $SmB_6$ layer, the critical current density required by the former is only 30% and 13% of the latter, when temperature is 20 K and 300 K (ambient room temperature), respectively. Thus, various advantages of some example embodiments are evident.

Although examples have been shown and described in this specification and figures, it would be appreciated that changes may be made to the illustrated and/or described examples without departing from their principles and spirit, the scope of which is defined by the following claims and their equivalents.

The invention claimed is:

1. A magneto-electronic device, comprising:

a spin-orbit torque (SOT) generator layer;

a magnetic memory layer on the SOT generator layer; and sensing electrodes configured to measure an anomalous Hall effect of the magnetic memory layer;

wherein the SOT generator layer comprises topological insulator material, and wherein the magnetic memory layer comprises ferromagnetic material with perpendicular magnetic anisotropy.

2. The magneto-electronic device of claim 1, wherein the SOT generator layer comprises at least one of $SmB_6$, $YbB_6$, $YbB_{12}$, $Bi_2Se_3$, $Bi_2Te_3$, $Sb_2Te_3$, or $BiSbTeSe_2$.

3. The magneto-electronic device of claim 1, wherein the SOT generator layer comprises at least one of α-Sn, $Bi_{1-x}Sb_x$, Sb, $Bi_2Te_2Se$, $Bi_2Te_3$, $Sb_2Te_3$, $Bi_{2-x}Sb_xTe_{3-y}Se_y$, $Bi_2Te_{3-x}Se_x$, $Bi_2Te_{3-x}S_x$, $Sb_2Te_2Se$, $Bi_2Te_2Se$, $Bi_2Se_2Se$, $Bi_2Te_2S$, $Bi_2Se_2S$, $TlBiSe_2$, $TlBiTe_2$, $TlBiS_2$, $TlBiSe_2$, $PbBi_2Te_4$, $PbSb_2Te_4$, $GeBi_2Te_4$, $PbBi_4Te_7$, $GeBi_{4-x}Sb_xTe_7$, $Pb_5(Bi_2Se_3)_6$, $Se_5(Bi_2Se_3)_6$, $(Bi_2)(Bi_2Se_{3-x}S_x)$, $(Bi_2)(Bi_2Te_3)_2$, SnTe, $Pb_{1-x}Sn_xTe$, $Pb_{1-x}Sn_xSe$, $Ag_2Te$, $Bi_{14}Rh_3I_9$, LuBiPt, DyBiPt, GdBiPt, or $Nd_2(Ir_{1-x}Rh_x)_2O_7$.

4. The magneto-electronic device of claim 1, wherein the magnetic memory layer comprises a nonmagnetic metal buffer layer, a magnetic metal layer, and an insulating layer, wherein the nonmagnetic metal buffer layer comprises at least one of bismuth (Bi), copper (Cu), gold (Au), hafnium (Hf), iridium (Ir), lead (Pb), molybdenum (Mo), niobium (Nb), osmium (Os), palladium (Pd), platinum (Pt), rhenium (Re), ruthenium (Ru), tantalum (Ta), thallium (Tl), tungsten (W), any alloy thereof, or any combination thereof, wherein the magnetic metal layer comprises at least one of cobalt (Co), iron (Fe), CoFeB, CoPd, CoPt, FePd, FePt, any alloy thereof, or any combination thereof, and wherein the insulating layer comprises at least one of $AlO_x$, boron nitride (BN), $HfO_2$, magnesium oxide (MgO), boron-doped MgO, silicon oxide (SiO, $SiO_2$), tantalum oxide ($TaO_2$, $Ta_2O_5$), stoichiometric or non-stoichiometric titanium oxide (TiO, $TiO_2$, $Ti_2O_3$), or zirconium oxide (ZrO, $ZrO_2$).

5. The magneto-electronic device of claim 1, wherein the magnetic memory layer comprises at least one of cobalt (Co), iron (Fe), CoFeAl, CoFeB, CoMnSi, CoPd, CoPt, CoTb, FePd, FePt, GdCo, MnGa, MnGe, MnSi, $Mn_3Ga$, $Mn_3Ge$, $Mn_3Sn$, TeFeCo, [Co/Ni]n multilayers, [Co/Pd]n multilayers, [Co/Pt]n multilayers, any alloy thereof, or any combination thereof, and wherein 'n' is greater than or equal to 1 and less than or equal to 10.

6. The magneto-electronic device of claim 1, further comprising:

a nonmagnetic spacing layer on the magnetic memory layer; and a magnetic pinning layer on the nonmagnetic spacing layer.

7. The magneto-electronic device of claim 6, wherein the magnetic pinning layer comprises at least one of chromium (Cr), cobalt (Co), iron (Fe), nickel (Ni), manganese (Mn), palladium (Pd), platinum (Pt), FeMn, IrMn, PtMn, $Mn_3Ga$, $Mn_3Ge$, $Mn_3Sn$, chromium oxide (CrO, $Cr_2O_3$), cobalt oxide (CoO, $Co_2O_3$, $Co_3O_4$), manganese oxide (MnO, $Mn_2O_3$, $Mn_3O_4$), nickel oxide (NiO, $Ni_2O_3$), any alloy thereof, or any combination thereof.

8. A magneto-electronic device, comprising:

a spin-orbit torque (SOT) generator layer;

a first magnetic memory layer on the SOT generator layer;

an insulating layer on the first magnetic memory layer; and a second magnetic memory layer on the insulating layer;

wherein the SOT generator layer comprises topological insulator material, wherein the magneto-electronic device is configured to originate spin current in the SOT generator layer using a switching current within the SOT generator layer, and wherein the first magnetic memory layer and the second magnetic memory layer comprise ferromagnetic material with either perpendicular magnetic anisotropy or in-plane magnetic anisotropy.

9. The magneto-electronic device of claim 8, wherein the SOT generator layer comprises at least one of $SmB_6$, $YbB_6$, $YbB_{12}$, $Bi_2Se_3$, $Bi_2Te_3$, $Sb_2Te_3$, or $BiSbTeSe_2$.

10. The magneto-electronic device of claim 8, wherein the SOT generator layer comprises at least one of t-Sn, $Bi_{1-x}Sb_x$, Sb, $Bi_2Te_2Se$, $Bi_2Te_3$, $Sb_2Te_3$, $Bi_{2-x}Sb_xTe_{3-y}Se_y$, $Bi_2Te_{3-x}Se_x$, $Bi_2Te_{3-x}S_x$, $Sb_2Te_2Se$, $Bi_2Te_2Se$, $Bi_2Se_2Se$, $Bi_2Te_2S$, $Bi_2Se_2S$, $TlBiSe_2$, $TlBiTe_2$, $TlBiS_2$, $TlBiSe_2$, $PbBi_2Te_4$, $PbSb_2Te_4$, $GeBi_2Te_4$, $PbBi_4Te_7$, $GeBi_{4-x}Sb_xTe_7$, $Pb_5(Bi_2Se_3)_6$, $Se_5(Bi_2Se_3)_6$, $(Bi_2)(Bi_2Se_{3-x}S_x)$, $(Bi_2)(Bi_2Te_3)_2$, SnTe, $Pb_{1-x}Sn_xTe$, $Pb_{1-x}Sn_xSe$, $Ag_2Te$, $Bi_{14}Rh_3I_9$, LuBiPt, DyBiPt, GdBiPt, or $Nd_2(Ir_{1-x}Rh_x)_2O_7$.

11. The magneto-electronic device of claim 8, wherein the first magnetic memory layer and the second magnetic memory layer comprise ferromagnetic material with the perpendicular magnetic anisotropy.

12. The magneto-electronic device of claim 11, wherein the first magnetic memory layer and the second magnetic memory layer comprise at least one of cobalt (Co), iron (Fe), CoFeAl, CoFeB, CoMnSi, CoPd, CoPt, CoTb, FePd, FePt, GdCo, MnGa, MnGe, MnSi, $Mn_3Ga$, $Mn_3Ge$, $Mn_3Sn$, TeFeCo, [Co/Ni]n multilayers, [Co/Pd]n multilayers, [Co/Pt]n multilayers, any alloy thereof, or any combination thereof, and wherein 'n' is greater than or equal to 1 and less than or equal to 10.

13. The magneto-electronic device of claim 8, wherein the first magnetic memory layer and the second magnetic memory layer comprise ferromagnetic material with the in-plane magnetic anisotropy.

14. The magneto-electronic device of claim 13, wherein the first magnetic memory layer and the second magnetic memory layer comprise at least one of cobalt (Co), iron (Fe), CoFe, CoFeAl, CoFeB, CoMnSi, NiFe, any alloy thereof, or any combination thereof.

15. The magneto-electronic device of claim 8, wherein the insulating layer comprises at least one of $AlO_x$, boron nitride (BN), $HfO_2$, magnesium oxide (MgO), boron-doped MgO, silicon oxide (SiO, $SiO_2$), tantalum oxide ($TaO_2$, $Ta_2O_5$), stoichiometric or non-stoichiometric titanium oxide (TiO, $TiO_2$, $Ti_2O_3$), or zirconium oxide (ZrO, $ZrO_2$).

16. The magneto-electronic device of claim 8, further comprising:

a substrate;

wherein the SOT generator layer is on the substrate.

17. The magneto-electronic device of claim 8, further comprising:

a capping layer on the second magnetic memory layer.

18. A magneto-electronic device, comprising:

a first layer;

a second layer on the first layer;

a third layer on the second layer; and a fourth layer on the third layer;

wherein the first layer comprises topological insulator material, wherein the second layer comprises first ferromagnetic material with either perpendicular magnetic anisotropy or in-plane magnetic anisotropy, wherein the third layer comprises insulating material, wherein the fourth layer comprises second ferromagnetic material with either the perpendicular magnetic anisotropy or the in-plane magnetic anisotropy, and wherein the magneto-electronic device is configured to originate spin current in the topological insulator material using a switching current within the first layer.

19. The magneto-electronic device of claim 18, further comprising:

a substrate;

wherein the first layer is on the substrate.

20. The magneto-electronic device of claim 18, further comprising:

a fifth layer on the fourth layer;

wherein the fifth layer comprises a capping layer.

* * * * *